(12) United States Patent
Papageorge et al.

(10) Patent No.: US 10,540,604 B1
(45) Date of Patent: Jan. 21, 2020

(54) OPERATING A QUANTUM PROCESSOR HAVING A THREE-DIMENSIONAL DEVICE TOPOLOGY

(71) Applicant: Rigetti & Co, Inc., Berkeley, CA (US)

(72) Inventors: Alexander Papageorge, San Francisco, CA (US); Benjamin Jacob Bloom, Oakland, CA (US); Anthony Polloreno, Carlsbad, CA (US); Sabrina Sae Byul Hong, Oakland, CA (US); Nasser Alidoust, Berkeley, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 16/409,975

(22) Filed: May 13, 2019

Related U.S. Application Data

(60) Provisional application No. 62/671,579, filed on May 15, 2018.

(51) Int. Cl.
| | | |
|---|---|---|
| *G06N 10/00* | (2019.01) | |
| *H03K 19/195* | (2006.01) | |
| *G06N 99/00* | (2019.01) | |
| *G06N 3/06* | (2006.01) | |
| *G06N 20/00* | (2019.01) | |
| *G06F 13/36* | (2006.01) | |

(Continued)

(52) U.S. Cl.
CPC .............. *G06N 10/00* (2019.01); *G06F 13/36* (2013.01); *G06F 13/4068* (2013.01); *G06N 3/06* (2013.01); *G06N 5/022* (2013.01); *G06N 20/00* (2019.01); *H03K 19/195* (2013.01)

(58) Field of Classification Search
CPC .......... G06N 10/00; G06N 3/04; G06N 5/003; G06N 7/04; H03K 19/195; H03K 3/38; H01L 39/223; H01L 27/18; H01L 39/045; H01L 39/2493; H01L 39/025; H01L 21/76891; H01L 29/127; H01L 49/006
See application file for complete search history.

(56) References Cited

U.S. PATENT DOCUMENTS

| | | |
|---|---|---|
| 6,456,994 B1 | 9/2002 | Tucci |
| 8,164,082 B2 | 4/2012 | Friesen |
| 9,892,365 B2 * | 2/2018 | Rigetti ..................... G06F 13/36 |

(Continued)

OTHER PUBLICATIONS

Naik, et al., "Random access quantum information processors", arXiv:1705:00579, May 1, 2017, 7 pgs.

*Primary Examiner* — Vibol Tan
(74) *Attorney, Agent, or Firm* — Henry Patent Law Firm PLLC

(57) ABSTRACT

In a general aspect, three-dimensional integrated multilayer architectures for qubit devices organized in quantum processors are described herein. In some aspects, a quantum processor includes devices residing in multiple physical layers. The quantum processor also includes connections that interconnect the devices in a tree structure topology. A computational state is encoded in child qubit devices in a first layer of the tree structure topology. A quantum control sequence is applied to at least one of the devices to transform the computational state. Applying the quantum control sequence includes using one or more parent qubit devices in a second layer of the tree structure topology to mediate between child qubit devices in the first layer of the tree structure topology. A readout of the transformed computational state may be performed.

21 Claims, 4 Drawing Sheets

(51) Int. Cl.
    *G06F 13/40*     (2006.01)
    *G06N 5/02*     (2006.01)

(56) References Cited

U.S. PATENT DOCUMENTS

| | | | |
|---|---|---|---|
| 9,979,400 B1 * | 5/2018 | Sete | G06N 10/00 |
| 10,056,908 B2 * | 8/2018 | Rigetti | G01R 33/02 |
| 10,127,499 B1 * | 11/2018 | Rigetti | G06N 10/00 |
| 10,169,714 B2 * | 1/2019 | Chow | H01L 25/04 |
| 10,192,168 B2 * | 1/2019 | Rigetti | G06F 13/36 |
| 10,248,491 B1 * | 4/2019 | Zeng | G06N 10/00 |
| 10,255,555 B2 * | 4/2019 | Curtis | G06N 10/00 |
| 10,289,960 B2 * | 5/2019 | Chow | H01L 25/04 |
| 10,304,004 B2 * | 5/2019 | Chow | H01L 25/04 |
| 10,304,005 B2 * | 5/2019 | Chow | H01L 25/04 |
| 10,325,218 B1 * | 6/2019 | Zeng | G01R 31/3177 |
| 10,332,024 B2 * | 6/2019 | Scheer | G06F 15/82 |
| 10,374,612 B1 * | 8/2019 | Sinclair | G06N 10/00 |
| 10,402,743 B1 * | 9/2019 | Rigetti | G06N 10/00 |
| 2016/0267032 A1 | 9/2016 | Rigetti et al. | |
| 2016/0292586 A1 | 10/2016 | Rigetti et al. | |
| 2016/0292587 A1 | 10/2016 | Rigetti et al. | |
| 2016/0364653 A1 | 12/2016 | Chow et al. | |
| 2017/0140296 A1 | 5/2017 | Kerman | |
| 2017/0230050 A1 | 8/2017 | Rigetti et al. | |
| 2017/0323206 A1 | 11/2017 | Alipour Khayer et al. | |

\* cited by examiner

OPERATING A QUANTUM PROCESSOR HAVING A THREE-DIMENSIONAL DEVICE TOPOLOGY

CROSS-REFERENCE TO RELATED APPLICATIONS

This application claims priority to U.S. Provisional Application No. 62/671,579 filed May 15, 2018 and entitled "Operating a Quantum Processor Having a Three-Dimensional Device Topology." The contents of the above-referenced priority application are hereby incorporated by reference.

BACKGROUND

The following description relates to operating a quantum processor that has a three-dimensional device topology.

In some quantum computing architectures, qubits are implemented in superconducting circuit devices defined on a substrate. The qubits can be implemented, for example, in circuit devices that include Josephson junctions. The circuit devices are typically interconnected by connections defined on the substrate, for example, between neighboring pairs of circuit devices.

DETAILED DESCRIPTION

Figure 1:
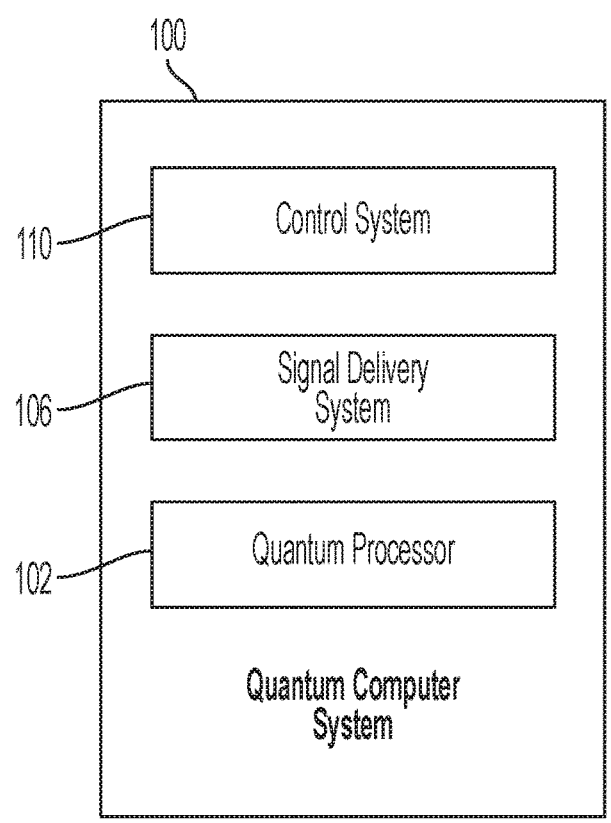
FIG. 1 is a block diagram of an example quantum computing system.

In some aspects of what is described here, a quantum processor includes qubit devices arranged in a three-dimensional integrated multilayer architecture. The three-dimensional integration can include three-dimensional spatial connectivity between qubit devices distributed along three spatial dimensions. For instance, multiple substrates that each have qubit devices on them can be stacked and interconnected vertically, for example, using through-vias to provide connections between the substrates. In such a way, interconnected substrates can operate as part of an integrated quantum processor. In some cases, a three-dimensional integration of qubit devices permits or otherwise facilitates qubits to be arranged more densely (i.e., higher spatial density of qubits in the quantum processor) and with higher connectivity, which may lead to improved performance and other advantages.

In some implementations, a three-dimensional integration can enable more efficient interconnect routing to large arrays of qubits, e.g., in a given layer of a quantum processor. This can allow for denser qubit-qubit coupling geometries and increased connectivity between qubits, including increased connectivity beyond nearest-neighbor interactions, while limiting interactions between qubits on different layers in a way that can decrease the negative impacts of frequency crowding on quantum computational performance. In some cases, a three-dimensional integration can provide a solution to crowding of connections (e.g., of connections to or within a quantum processor) that can occur, for example, in architectures having large numbers of devices in a two-dimensional array without three-dimensional integration.

In some cases, design and fabrication complexity for three-dimensional integration can be reduced by using an architecture that utilizes qubits and clusters of qubits in individual layers to indirectly couple with other qubits and clusters of qubits within the same individual layer. In some aspects, such an indirect coupling can be realized by coupling the qubits through intermediary connections (e.g., between resonators and ancilla qubits) in one or more other layers (e.g., utilizing the third dimension of the quantum processor). In some implementations, distinct clusters of qubits in an individual layer can be topologically connected in a tree structure topology irrespective of the physical placement of the qubit devices across and within the layer. Accordingly, the complexity of fabricating each successive layer can be reduced. Moreover, a tree structure topology may permit a scalable way for two-dimensional arrays of qubit devices in an individual physical layer to be fully coupled to one another (e.g., using ancilla qubit devices in other physical layers). In some cases, the number of ancilla qubit devices in each layer of the tree structure topology is a logarithmic function of the number of qubit devices in the first layer of the tree structure topology (e.g., the number of leafs in the tree structure).

In some implementations, a tree representing the topological connections of the qubit devices can include clusters of child qubit devices connected to parent qubit devices, where each child qubit device in a cluster is connected to a common parent qubit device. The child qubit devices may be in the same physical layer of the quantum processor, or they may be distributed across multiple physical layers. The tree structure can include leaves representing quantum devices that are not parent qubit devices (and therefore do not have child qubit devices). In some implementations, each child qubit device representing a leaf in the tree structure can operate as an individual (e.g., single) qubit. Alternatively or additionally, multiple child qubit devices corresponding to leaves in the tree structure can operate collectively as a logical qubit. The operational qubits of a layer (e.g., the first layer) in a tree structure topology can be partially or fully coupled to one another through the mediation of ancilla qubit devices that can be in additional (e.g., second or higher) layers of the tree structure topology. In some cases, one or more child qubit devices can operate collectively with one or more ancilla qubit devices (which are above the child qubit devices in the tree structure topology) as a logical qubit. In some implementations, the three-dimensional topology can be described by a graph having the unit structure shown and described in connection with FIG. 2, to be discussed below.

In some implementations, the first (lowest) layer of the tree structure topology includes measurable qubits. For example, the qubit devices in the first layer can be connected to respective readout devices (e.g., readout resonators) that can be used to detect the quantum state of the qubit devices. In some cases, the readout resonators can be coupled to the qubits, for example, by using flip-chip bonding techniques. In some cases, the qubit devices in the first layer have relatively long coherence times, for instance, as compared with the other qubit devices (e.g., ancilla qubit devices) in the quantum processor. For instance, the qubit devices in the first layer can be implemented using fixed-frequency transmon qubit devices, while qubits in the higher layers can be implemented as tunable-frequency transmon qubit devices. Other types of qubit devices may be used.

In some implementations, the qubit devices in the first (lowest) layer of the tree structure are coupled (e.g., capacitively, inductively, or galvanically coupled) to qubit devices in the second layer. For example, the qubit devices in the second layer can include tunable-frequency transmon qubit devices, and the qubit devices in the first layer can be coupled to a resonator bus in the second layer, with the resonator bus coupled to a tunable-frequency transmon qubit device in the second layer. The resonator bus can be implemented by a circuit device or other physical structure that can support a collection of resonant modes. For instance, the resonator bus may include an array of resonator devices, an array of inductor and capacitor structures, one or more multimode resonators that can carry multiple frequencies, or other types of elements. Each resonator bus can be configured to couple multiple distinct pairs of qubit devices (e.g., each pair having different operating frequencies or operating frequency differences). In some examples, resonator buses can be used to perform concurrent entangling operations on multiple pairs of qubits. For instance, if a resonator bus in the second layer is coupled to four qubit devices in the first layer (e.g., four children in a tree structure), it can be used to mediate two-qubit entangling gates between multiple pairs of those qubits simultaneously.

In some implementations, qubit states associated with a computational state encoded in the quantum processor can be moved from fixed-frequency qubit devices in the first layer to tunable-frequency qubit devices in the second layer, for example, by the application of a parametric control signal to the tunable-frequency transmon qubits. In some implementations, qubit states associated with the computational state can be transferred from qubit devices in the first layer to a resonator bus on the second layer, for example, by the application of parametric control signals on the qubit devices in the first layer. From the resonator bus, the qubit states can be transferred, for example, to other qubit devices in the first layer or qubit devices in the second layer. In some implementations, additional layers of the quantum processor (for example, third layer, fourth layer, etc.) above the second layer can include tunable-frequency transmon qubit devices that are coupled by resonator buses to qubit devices on the layer below them.

In some implementations, a tree structure device topology, which can include qubit devices in multiple layers and connections between the qubit devices in the different layers, can provide connectivity between all pairs of qubit devices, and the path length between pairs of qubit devices can scale with the logarithm of the number of qubits in the quantum processor. Moreover, a tree structure device topology may provide a scalable solution to increasing the connectivity between qubit devices in a single layer. For example, a branching factor of two successive layers associated with the tree structure of the qubits can determine the degree of logarithmic scaling in connecting any arbitrary pair of qubits. In some aspects, the branching factor (which characterizes the number of children for each parent) between adjacent layers can be selected to minimize communication bottlenecks, correct for specific error syndromes when generating logical qubits, or engineer common quantum circuits, and run quantum algorithms. In some aspects, by matching the qubit device form to function, a quantum computing apparatus can be constructed that can more efficiently use the various types of non-linear and linear quantum devices in a quantum computer (for example, Josephson junctions, resonators, inductors, capacitors, interconnects, and the like).

In some implementations, the base layer (the first or lowest layer) of the tree structure topology can include computational qubits, while the higher layers (second layer and greater) of the tree structure can include ancilla qubits. In some aspects, the ancilla qubits can serve as "scratch-pad" qubits, that is, qubits that are useful in computation and the implementation of quantum logic gates and algorithms, but whose states are not necessary to track (e.g., track by resonators and peripheral electronic devices). In some cases, the base layer can define the computational qubits in fixed-frequency transmon qubit devices, while the ancilla qubits in higher layers (second layer and greater) can be defined in tunable-frequency transmon qubit devices. For instance, fixed-frequency qubit devices in the base layer may exhibit greater coherence time, whereas the qubit devices in higher levels may have less stringent requirements (e.g., in a fabrication process). Other types of qubit devices may be used. In some cases, the qubit devices in the base layer can be coupled to readout resonators in the base layer, which can be operated to measure the qubit states defined in the qubit devices.

In some implementations, the layers above the base layer of the tree structure topology provide connections that can be used to mediate between all pairs of qubit devices in the base layer. The qubit devices in a given layer in such a configuration can be fabricated independently from the qubit devices in another layer, leading to manufacturing advantages, for example, higher three-dimensional quantum processor yields. In some cases, a three-dimensional device topology can be used to reduce noise and sensitivity to environmental parameters or to provide other types of advantages that can improve the operation of the quantum processor.

In some cases, the qubit devices are organized in a three-dimensional topology that can be represented as a binary tree structure (e.g., as shown and described in connection with FIG. 2). In some cases, the qubit devices are organized in a three-dimensional device topology that can be represented as a tree structure having higher branching factors, for example, three, four, five, etc. number of sub-trees per node.

In some implementations, a quantum processor does not provide direct coupling between qubit devices within the first (lowest) layer of the three-dimensional device topology. For example, the qubit devices in the first layer can be coupled to each other indirectly, through devices (e.g., other qubit devices) in one or more other layers (above the first layer). In some implementations, the quantum processor does provide direct coupling between qubit devices within the first layer. For example, the qubit devices within one or more layers may be organized in clusters, with direct connections between pairs of qubit devices within each cluster. Distinct clusters within a layer may be connected indirectly through devices in one or more other layers. For example, in some cases the first layer does not provide direct coupling between qubit devices of different clusters, and a given qubit device in a first cluster in a first layer can be coupled to a qubit device in a second cluster in the first layer by coupling to one or more qubit devices in a second, higher layer, which can mediate the interaction between clusters. In some implementations, there may be any integer number of clusters on the first layer or subsequent layers of the quantum processor employing such a tree-like multilayer configuration of devices.

FIG. 1 is a schematic diagram of an example quantum computing system 100. The example quantum computing system 100 shown in FIG. 1 includes a control system 110, a signal delivery system 106, and a quantum processor 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. Control signals can manipulate the quantum states of individual qubits and the joint states of multiple qubits. In some instances, conditional quantum logic can be performed in a manner that allows large-scale entanglement within the quantum processor 102. In some instances, information can be read out from the composite quantum system by measuring the quantum states of the individual qubits.

In some implementations, the quantum processor 102 can operate using gate-based models for quantum computing. For example, the qubits can be initialized in an initial state, and a quantum logic circuit comprised of a series of quantum logic gates can be applied to transform the qubits and extract measurements representing the output of the quantum computation. In some implementations, the quantum processor 102 can operate using adiabatic or annealing models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, quantum error correcting schemes can be deployed to achieve fault-tolerant quantum computation, or other computational regimes may be used. Pairs of qubits can be addressed, for example, with two-qubit logic operations that are capable of generating entanglement, independent of other pairs of qubits. In some implementations, more than two qubits can be addressed, for example, with multi-qubit quantum logic operations capable of generating multi-qubit entanglement. In some implementations, the quantum processor 102 is constructed and operated according to a scalable quantum computing architecture. For example, in some cases, the architecture can be scaled to a large number of qubits to achieve large-scale general purpose coherent quantum computing.

The example quantum processor 102 shown in FIG. 1 includes qubit devices that are used to store and process quantum information. The qubit devices in the quantum processor 102 can be implemented according to any of the examples described herein. In some instances, all or part of the quantum processor 102 functions as a quantum information processor, a quantum memory, or another type of subsystem.

In some implementations, the quantum processor 102 includes devices in multiple physical layers, and connections between the devices that define a tree structure topology. For instance, the quantum processor 102 may be implemented and operated as shown and described with respect to FIGS. 2, 3 and 4, or otherwise.

In some cases, the quantum processor 102 includes a superconducting circuit, and the qubit devices are implemented as circuit devices that include Josephson junctions, for example, in superconducting quantum interference device (SQUID) loops or other arrangements, and are controlled by radio-frequency signals, microwave signals, and bias signals delivered to the quantum processor 102. In some cases, the quantum processor 102 includes an ion trap system, and the qubit devices are implemented as trapped ions controlled by optical signals delivered to the quantum processor 102. In some cases, the quantum processor 102 includes a spin system, and the qubit devices are implemented as nuclear or electron spins controlled by microwave or radio-frequency signals delivered to the quantum processor 102. The quantum processor 102 may be implemented based on another physical modality of quantum computing.

In the example quantum processor 102, the qubit devices each store a single qubit (a bit of quantum information), and the qubits can collectively define the computational state of a quantum information processor or quantum memory. The quantum processor 102 may also include readout devices that selectively interact with the qubit devices to detect their quantum states. For example, readout resonators may be configured to produce readout signals that indicate a computational state of the quantum processor or quantum memory. The quantum processor 102 may also include coupler devices that selectively operate on individual qubits or pairs of qubits. For example, the coupler devices may produce entanglement or other multi-qubit states over two or more qubits in the quantum processor 102.

In some implementations, the example quantum processor 102 can process the quantum information stored in the qubits by applying control signals to the qubit devices or to other devices housed in the quantum processor. The control signals can be configured to encode information in the qubit devices, to process the information by performing logical gates or other types of operations, or to extract information from the qubit devices. In some examples, the operations can be expressed as single-qubit gates, two-qubit gates, or other types of logical gates that operate on one or more qubits. A sequence of operations can be applied to the qubits to perform a quantum algorithm. The quantum algorithm may correspond to a computational task, a quantum error correction procedure, a quantum state distillation procedure, or a combination of these and other types of operations.

In the example shown in FIG. 1, the signal delivery system 106 provides communication between the control system 110 and the quantum processor 102. For example, the signal delivery system 106 can receive control signals from the control system 110 and deliver the control signals to the quantum processor 102. In some instances, the signal delivery system 106 performs preprocessing, signal conditioning, or other operations to the control signals before delivering them to the quantum processor 102. The signal delivery system 106 may also receive readout signals or other signals from the quantum processor 102 and deliver the signals to the control system 110.

In some implementations, the signal delivery system 106 includes input and output processing hardware, input and output connections, and other components. The input and output processing hardware may include, for example, filters, attenuators, directional couplers, multiplexers, diplexers, bias components, signal channels, isolators, amplifiers, power dividers and other types of components. In some implementations, the signal delivery system 106 provides connections between different temperature and noise regimes. For example, the quantum computing system 100 may include a series of temperature stages between a higher temperature regime of the control system 110 and a lower temperature regime of the quantum processor 102.

In the example quantum computing system 100 shown in FIG. 1, the control system 110 controls operation of the quantum processor 102. The example control system 110 may include data processors, signal generators, interface components and other types of systems or subsystems. In some cases, the control system 110 includes one or more classical computers or classical computing components.

In some implementations, the control system 110 includes a classical computing system that executes software to compile instructions for the quantum processor 102. For example, the control system 110 may decompose a quantum logic circuit or quantum computing program into discrete control operations or sets of control operations that can be executed by the hardware in the quantum computing system 100. In some examples, the control system 110 applies a quantum logic circuit by generating signals that cause the qubit devices and other devices in the quantum processor 102 to execute operations. For instance, the operations may correspond to single-qubit gates, two-qubit gates, qubit measurements, etc. The control system 110 can generate control signals that are communicated to the quantum processor 102 by the signal delivery system 106, and the devices in the quantum processor 102 can execute the operations in response to the control signals.

In some cases, the control system 110 includes one or more classical computers or classical computing components that produce a control sequence, for instance, based on a quantum computer program. For example, a classical processor may convert a quantum computer program (e.g., instructions written in the Quil programming language) to an instruction set for the native gate set or architecture of the quantum processor 102. The quantum computer program may be generated locally, received from a remote system, or obtained in another manner.

In some cases, the control system 110 includes a microwave signal source (e.g., an arbitrary waveform generator), a bias signal source and other components that generate control signals to be delivered to the quantum processor 102. For example, the control signals may be configured to apply quantum logic gates by modulating transition frequencies of tunable qubit devices. For instance, the control system 110 may include one or more classical computers configured to determine a modulation frequency, total interaction time, modulation amplitude, or other parameters for a parametrically activated quantum logic gate. The control signals may be generated based on a control sequence provided, for instance, by a classical processor in the control system 110. The example control system 110 may include conversion hardware that digitizes response signals received from the quantum processor 102. The digitized response signals may be provided, for example, to a classical processor in the control system 110.

In some cases, the quantum computing system 100 includes multiple quantum processors 102 that operate as respective quantum processor units (QPU). In some cases, each QPU can operate independent of the others. For instance, the quantum computing system 100 may be configured to operate according to a distributed quantum computation model, or the quantum computing system 100 may utilize multiple QPUs in another manner. In some implementations, the quantum computing system 100 includes multiple control systems, and each QPU may be controlled by a dedicated control system. In some implementations, a single control system can control multiple QPUs; for instance, the control system 110 may include multiple domains that each control a respective QPU.

Figure 2:
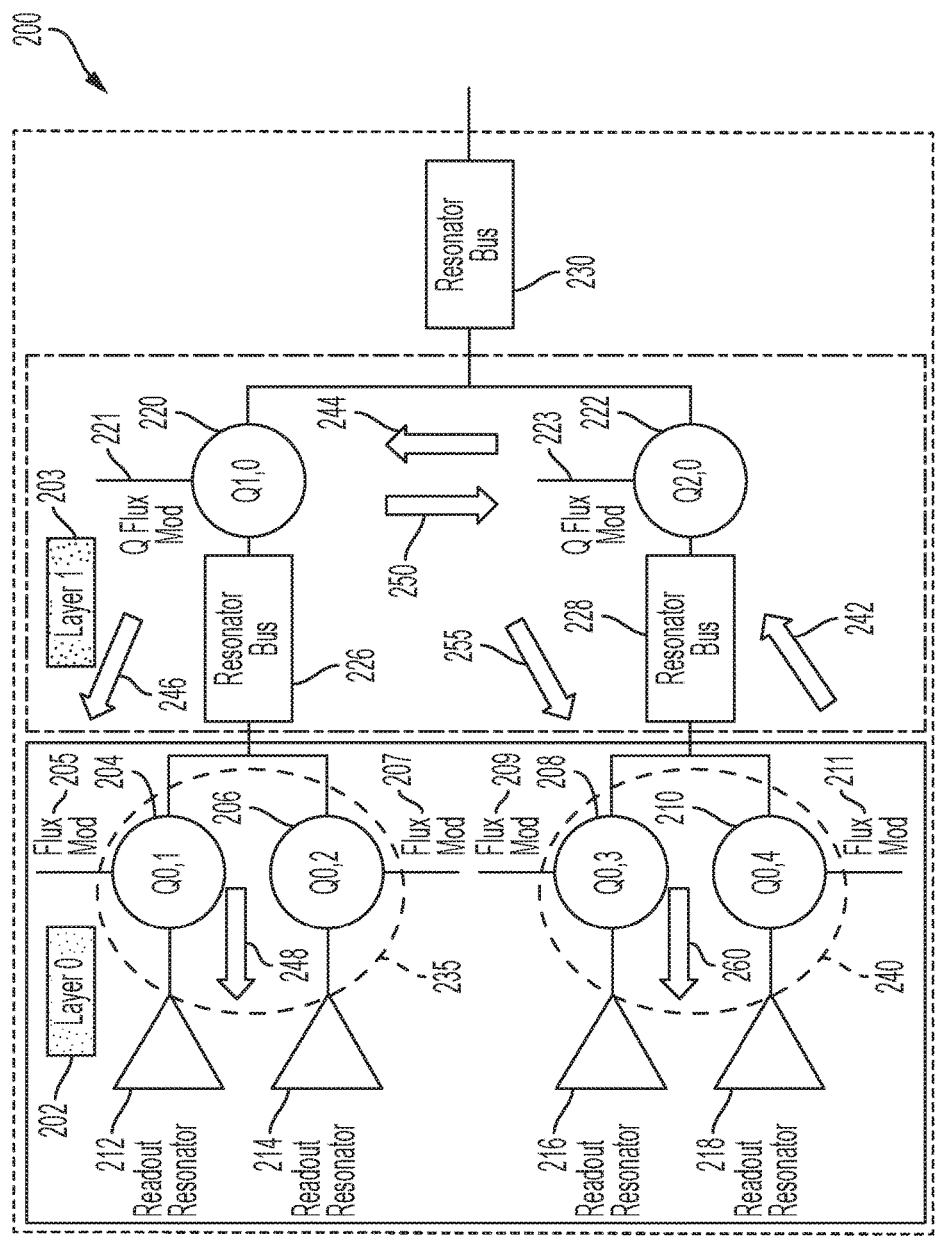
FIG. 2 is a block diagram showing example operations in a three-dimensional device topology of a quantum processor.

FIG. 2 is a block diagram showing example operations in a three-dimensional device topology 200 of an example quantum processor. The three dimensional device topology 200 may be deployed, for example, in the quantum processor 102 shown in FIG. 1 or in another type of system. The example three-dimensional device topology 200 shown in FIG. 2 can be used to form a three-dimensional integrated multilayer architecture in a quantum processor that includes a large number of qubit devices. For example, the example three-dimensional device topology 200 shown in FIG. 2 can be expanded to include additional layers and additional qubit devices and other devices within each layer.

The example three-dimensional device topology shown in FIG. 2 includes devices that can be deployed in multiple physical layers of a quantum processor (e.g., qubit devices, readout devices, etc.). The example three-dimensional device topology shown in FIG. 2 includes connections that interconnect the devices in a tree structure topology, which includes child devices (in a first layer 202 of the tree structure topology) and parent devices (e.g., in a second layer 203 of the tree structure topology).

In the example shown in FIG. 2, three-dimensional device topology 200 includes the first layer 202, which includes qubit devices Q(0,1) 204, Q(0,2) 206, Q(0,3) 208, and Q(0,4) 210. The qubit devices Q(0,1) 204, Q(0,2) 206, Q(0,3) 208, and Q(0,4) 210 are shown as examples of child qubit devices and may form a subset of the qubit devices in the first layer 202; for instance, there may be more than four qubit devices in the first layer 202. The devices in the first layer 202 shown in FIG. 2 may reside in the same physical layer in a quantum processor. In some cases, the devices shown in the first layer 202 in FIG. 2 may reside in multiple distinct physical layers of a quantum processor.

As shown in FIG. 2, the qubit devices in the first layer 202 each have a respective control line. The control line can be used to apply a flux modulation to manipulate the state of the associated qubit device. In some systems, the control line delivers radio frequency (RF) control signals. For instance, the qubit devices on the first layer 202 can include fixed-frequency transmon qubits, which can be controlled by a pulse amplitude and pulse duration of an RF signal. In some systems, the control line delivers other types of control signals (e.g., low frequency, adiabatic, or DC control signals). In the example shown, qubit device Q(0,1) is connected to control line 205, qubit device Q(0,2) is connected to control line 207, qubit device Q(0,3) is connected to control line 209, and qubit device Q(0,4) is connected to control line 211. As shown in FIG. 2, the qubit devices in the first layer 202 each have a respective readout device. Qubit device Q(0,1) is connected to readout device 212, qubit device Q(0,2) is connected to readout device 214, qubit device Q(0,3) is connected to readout device 216, and qubit device Q(0,4) is connected to readout device 218. Each qubit device may be connected to additional or different control lines, devices or other types of elements.

In the example shown in FIG. 2, three-dimensional device topology 200 includes the second layer 203, which includes qubit devices Q(1,0) 220 and Q(2,0) 222. The qubit devices Q(1,0) 220 and Q(2,0) 222 are shown as examples of parent qubit devices and may form a subset of the qubit devices in the second layer 203; for instance, there may be more than two qubit devices in the second layer 203. The devices in the second layer 203 shown in FIG. 2 may reside in the same physical layer in a quantum processor. In some cases, the devices shown in the second layer 203 in FIG. 2 may reside in multiple distinct physical layers of a quantum processor.

As shown in FIG. 2, the qubit devices in the second layer 203 each have a respective control line, which can be used to apply a flux modulation to manipulate the state of the associated qubit device. The qubit devices on the second layer 203 (and further qubit devices on subsequent layers, for example, when there are more than four qubits on the first layer 202) can include tunable-frequency transmon qubit devices, which can be controlled by an additional parameter of flux modulation in addition to the pulse amplitude and duration of the RF signal. Moreover, the tunable-frequency transmon qubit devices can have an operational frequency than can change because of the application of the flux modulation. As shown, qubit device Q(1,0) 220 is connected to control line 221, and qubit device Q(2,0) 222 is connected to control line 223.

In the example shown in FIG. 2, the qubit devices on the second layer 203 are connected (indirectly) to qubit devices on the first layer 201 via resonator buses. As shown, qubit device Q(1,0) 220 in the second layer 203 can be coupled to qubit device Q(0,1) 204 and qubit device (0,2) 206 in the first layer 202 by operation of a resonator bus 226, and qubit device Q(2,0) 222 in the second layer 203 can be coupled to qubit device Q(0,3) 208 and qubit device (0,4) 210 in the first layer 202 by operation of another resonator bus 228. Each of the example resonator buses can be configured for multimode operation, such that the qubit device Q(2,0) 222 (e.g., a tunable-frequency transmon qubit device) can be selectively coupled with either of the qubit devices Q(0,3) 208 and Q(0,4) 210 (e.g., fixed-frequency transmon qubit devices), which have distinct operational frequencies. Similarly, the qubit device Q(1,0) 220 (e.g., a tunable-frequency transmon qubit device) can be selectively coupled with either of the qubit devices Q(0,2) 206 and Q(0,1) 204 (e.g., fixed-frequency transmon qubit devices), which have distinct operational frequencies.

In the example shown in FIG. 2, the three-dimensional device topology 200 includes a third layer that includes a resonator bus 230. In some implementations, the two qubit devices Q(1,0) 220 and Q(2,0) 222 in the second layer 203 can be coupled through the resonator bus 230 in the third layer. The third layer can include additional or different devices, connections, and other elements, which may reside in a single physical layer of a quantum processor or in multiple distinct physical layers of a quantum processor.

In some implementations, qubit states of fixed-frequency transmon qubit devices (e.g., qubit devices Q(0,1) 204, Q(0,2) 206, Q(0,3) 208, and Q(0,4) 210) in the first layer 202 can be transferred to the tunable-frequency transmon qubit devices (e.g., qubit devices Q(1,0) 220, and Q(2,0) 222) in the second layer, in part, by the application of a parametric drive to the tunable-frequency transmon qubits. In some implementations, qubit states of qubit devices (e.g., qubits Q(0,1) 204, Q(0,2) 206, Q(0,3) 208, and Q(0,4) 210) in the first layer 202 can be transferred to one of the resonator buses (e.g., resonator buses 226 and 228) in the second layer 203 by the application of parametric control signals to the qubit devices in the first layer 202. Once a qubit state has been transferred to a resonator bus, the qubit state can be transferred to a qubit device (e.g., Q(0,1) 204, Q(0,2) 206, Q(0,3) 208, and Q(0,4) 210) in the first layer 202 or to a qubit device (e.g., Q(1,0) 220, and Q(2,0) 222) in the second layer 203. Qubit states may be transferred in another manner, in some cases.

In an example implementation, qubit devices Q(0,1) 204 and Q(0,2) 206 within a first cluster 235 are directly coupled to each other, and qubit devices Q(0,3) 208 and Q(0,4) 210 within a second cluster 240 are directly coupled to each other, all within the first layer 202. Qubit devices in the first cluster 235 and qubit devices in the second cluster 240 can be coupled to one another (intra-cluster, e.g., the qubit device Q(0,1) 204 coupled to the qubit device Q(0,2) 206 or the qubit device Q(0,3) 208 coupled to the qubit device Q(0,4) 210). As shown, qubit devices in the first cluster 235 are not directly coupled to qubit devices in the second cluster 240 within the first layer 202. In order to couple a qubit device of the first cluster 235 with a qubit device of the second cluster 240, the qubit devices of the first layer 202 can be first coupled to resonator buses or ancilla qubits in the second layer 203.

In some aspects of operation, qubit states defined in distinct clusters in the first layer 202 can be coupled by using hardware provided in the second layer 203. The arrows shown in FIG. 2 illustrate an example. At 242, the quantum states of the qubit device Q(0,4) 210 or the qubit device Q(0,3) 208 of the cluster 240 can be transferred through the resonator bus 228 to the ancilla qubit Q(2,0) 222 in the second layer 203. For instance, swap gates may be used to transfer qubit states between devices. At 244, the qubit state can be transferred from the ancilla qubit Q(2,0) 222 through the resonator bus 230 in the third layer to the ancilla qubit Q(1,0) 220 in the second layer 203. At 246, the ancilla qubit Q(1,0) 220 can be coupled to a qubit device in the cluster 240 in the first layer 202 through the resonator bus 226. For example, a two qubit gate or another type of quantum logic operation may be applied to the qubit states defined in the ancilla qubit Q(1,0) 220 and the qubit device Q(0,1) 204 or the qubit device Q(0,2) 206. At 248, the qubit states of the qubit devices in the cluster 235 can be read out by operation of the readout resonators 212 and 214. At 250, the quantum state of the ancilla qubit Q(1,0) 220 can be transferred through the resonator bus 230 in the third layer to the ancilla qubit Q(2,0) 222 in the second layer 203. At 255, the quantum state can be transferred from the ancilla qubit Q(2,0) 222 in the second layer 203 to a qubit device in the cluster 240 in the first layer 202 through the resonator bus 228. At 260, the qubit states of the qubit devices in the cluster 240 can be read out by operation of the readout resonators 216 and 218. The operations may be performed in another manner, for example, in parallel, in another order, or in conjunction with other operations. Similar processes can be followed between any pair of individual qubit devices in distinct clusters.

In some implementations, the example operations 242, 244, 246, 248, 250, 255, 260 shown in FIG. 2 are performed by applying a control sequence to one or more of the devices shown in FIG. 2, and the control sequence transforms a computational state in the quantum processor. In some instances, the control sequence uses parent qubit devices (220, 222) in the second layer 203 to mediate between the child qubit devices in one cluster (208, 210) and the child qubit devices in another cluster (204, 206). In some instances, all or part of the computational state is read out (e.g., at 248, 260).

Figure 3:
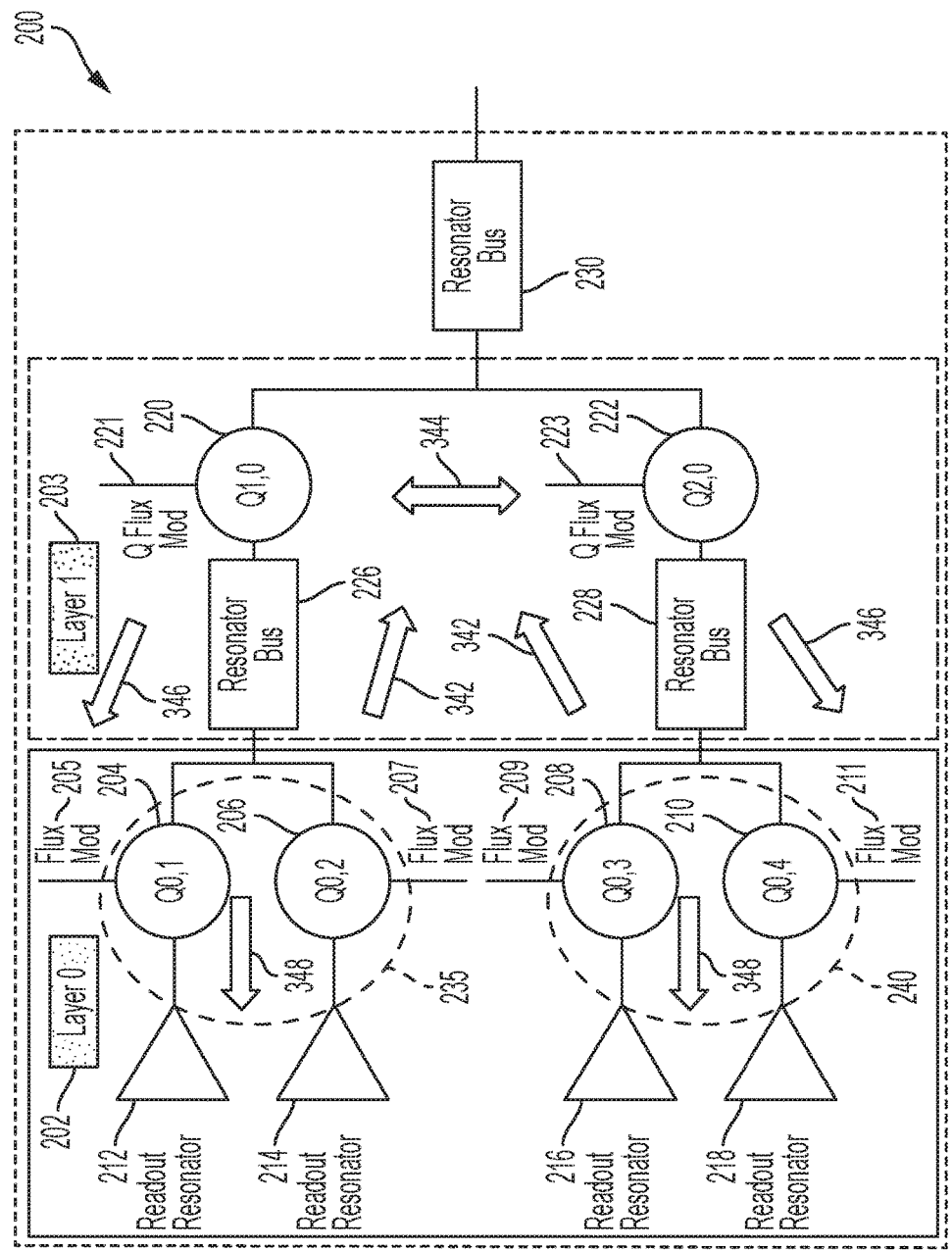
FIG. 3 is a block diagram showing example operations in a three-dimensional device topology of a quantum processor.

FIG. 3 is a block diagram showing example operations in the three-dimensional device topology 200 shown in FIG. 2. In particular, FIG. 3 shows another example aspect of operation, where qubit states defined in distinct clusters in the first layer 202 are coupled by using hardware provided in the second layer 203. The arrows shown in FIG. 3 illustrate an example. At 342, qubit states are transferred from both clusters 235, 240 in the first layer 202 to qubit devices in the second layer 203. The quantum state of the qubit device Q(0,4) 210 or the qubit device Q(0,3) 208 of the cluster 240 can be transferred through the resonator bus 228 to the ancilla qubit Q(2,0) 222 in the second layer 203. In parallel, the quantum state of the qubit device Q(0,2) 206 or the qubit device Q(0,1) 204 of the cluster 235 can be transferred through the resonator bus 226 to the ancilla qubit Q(1,0) 220 in the second layer 203. For instance, swap gates may be used to transfer qubit states between devices. At 344, the ancilla qubit Q(1,0) 220 can be coupled to the ancilla qubit Q(2,0) 222 through the resonator bus 230. For example, a two qubit gate or another type of quantum logic operation may be applied to the qubit states defined in the ancilla qubit Q(1,0) 220 and the ancilla qubit Q(2,0) 222. At 346, qubit states are transferred to both clusters 235, 240 in the first layer 202 from the qubit devices in the second layer 203. The quantum state of the ancilla qubit Q(2,0) 222 in the second layer 203 can be transferred through the resonator bus 228 to the qubit device Q(0,4) 210 or the qubit device Q(0,3) 208 in the cluster 240. In parallel, the quantum state of the ancilla qubit Q(1,0) 220 in the second layer 203 can be transferred through the resonator bus 226 to the qubit device Q(0,2) 206 or the qubit device Q(0,1) 204 in the cluster 235. At 348, the qubit states of the qubit devices in the first layer 202 can be read out by operation of the readout resonators 212, 214, 216, 218. The operations may be performed in another manner, for example, in parallel, in another order, or in conjunction with other operations. Similar processes can be followed between any pair of individual qubit devices in distinct clusters.

In some implementations, the example operations 342, 344, 346, 348 shown in FIG. 3 are performed by applying a control sequence to one or more of the devices shown in FIG. 3, and the control sequence transforms a computational state in the quantum processor. In some instances, the control sequence uses parent qubit devices (220, 222) in the second layer 203 to mediate between the child qubit devices in one cluster (208, 210) and the child qubit devices in another cluster (204, 206). In some instances, all or part of the computational state is read out (e.g., at 348).

Figure 4:
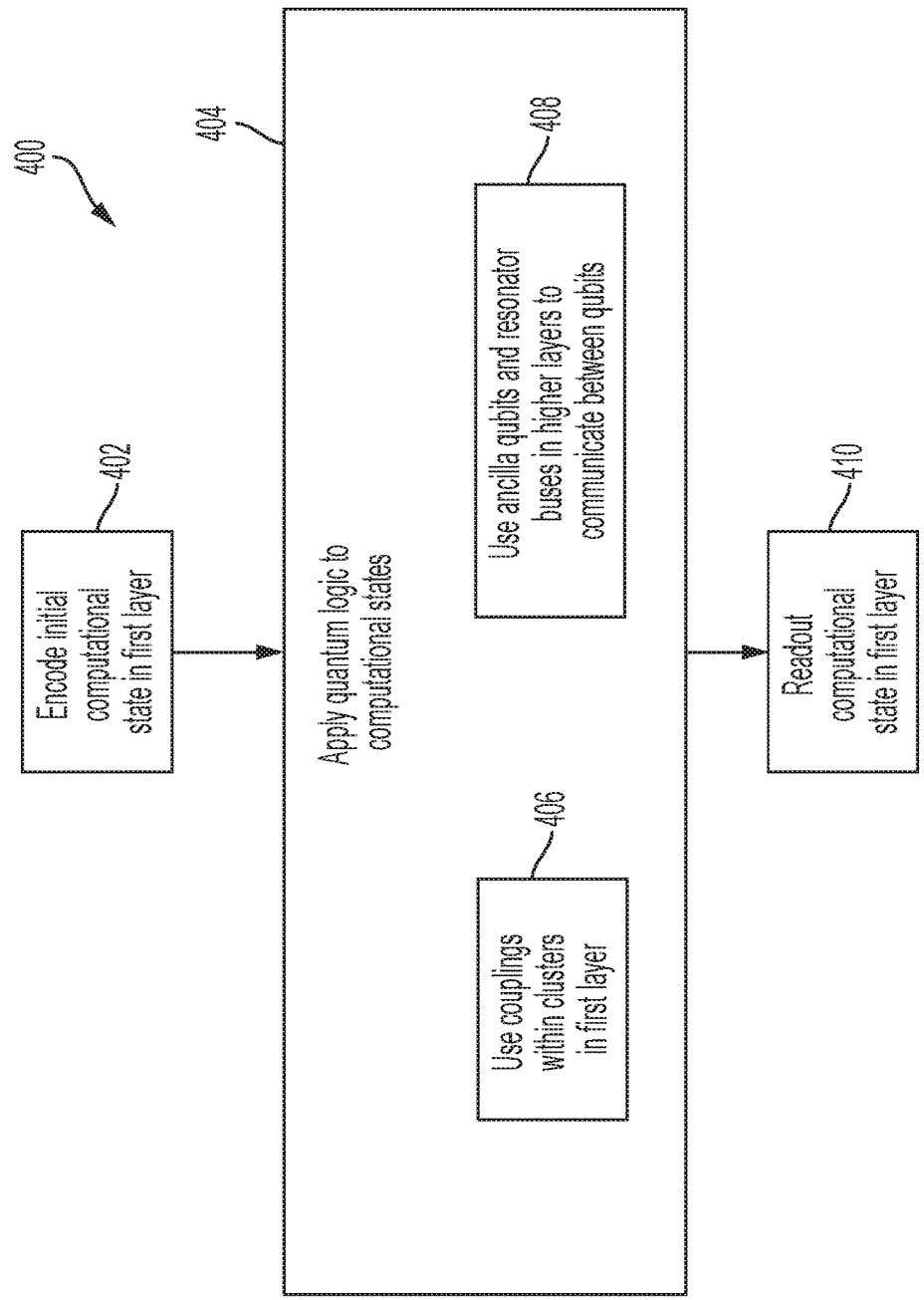
FIG. 4 is a flow chart showing an example process for operating a quantum processor having a three-dimensional device topology.

FIG. 4 is a flow chart showing an example process 400 for operating a quantum processor having a three-dimensional device topology. For example, the process 400 shown in FIG. 4 may be used to operate the example quantum processor 200 shown in FIGS. 2 and 3, or another type of quantum processor. The three-dimensional device topology includes at least two physical layers of qubit devices; in some cases, the three-dimensional device topology includes three, four, five or more (e.g., tens or hundreds) of physical layers of qubit devices.

In some implementations, the three-dimensional device topology of the quantum processor has a tree structure. For instance, the device topology can include a top layer (or root layer) and a bottom layer (or leaf layer), with one or more intermediate layers between the top layer and the bottom layer. The circuit devices in each layer may correspond to vertices of a tree structure. The device topology can further include connections between circuit devices in neighboring layers, such that the connections can correspond to edges of the tree structure. For instance, the top layer of the device topology can include a circuit device (e.g., a resonator device, a resonator bus, a qubit device, etc.) that is a root node of the tree structure; the first intermediate layer (below the top layer) can include two or more circuit devices that are children of the root node; and any successive intermediate layers (below the first intermediate layer) can include additional circuit devices that are children of the nodes in the layer above them. In some cases, all of the leaf nodes of the tree structure correspond to circuit devices in the bottom layer of the three-dimensional device topology, such that all the leaf nodes are deployed in a single physical layer of the quantum processor. In some cases, an intermediate layer can include one or more leaf nodes. In some cases, the three-dimensional device topology defines a binary tree structure, where each parent node has exactly two child nodes. In some cases, the three-dimensional device topology defines another type of tree structure. For instance, the tree structure may include nodes that have one, two, three, four or more children. In some cases, each layer of the tree structure can be implemented as a distinct substrate, and multiple substrates can be stacked vertically to define the hierarchical tree structure.

The example process 400 can be deployed in a quantum computing system, for example, the quantum computing system 100 shown in FIG. 1 or another type of quantum computing system. In some cases, the operations shown in FIG. 4 are initiated or executed by a control system, for instance, the control system 110 shown in FIG. 1 or another type of control system of a quantum computing system. The process 400 may include additional or different operations, and the operations may be performed in the order shown or in another order. In some cases, multiple operations are combined, performed in parallel or divided into additional operations.

At 402, an initial computational state is encoded in a first layer (e.g., the bottom layer described above) of the three-dimensional device topology. In some cases, the first layer can be implemented as a first substrate that includes qubit devices, for example, fixed-frequency transmon qubit devices or other qubit devices. In some cases, the qubit devices in the first layer are arranged in clusters, with pairs of qubit devices in each cluster directly coupled to one another (e.g., by capacitive or inductive coupling elements). The initial computational state can be encoded in the qubits defined by the qubit states in the first layer, for example, across multiple clusters. In some implementations, the encoding of the initial computational states into the qubit devices of the first layer can be performed by delivering control signals to the qubits devices. For instance, the control signals may be configured to write a known fiducial state to the qubits in the first layer.

At 404, quantum logic is applied to the computational states. Applying the quantum logic may include, for example, executing a quantum logic circuit or another type of quantum algorithm on the initial computational state defined at 402. In some implementations, the quantum logic is applied by delivering control signals to the qubit devices. The control signals can be configured to process the information encoded in the qubit devices, for example, by performing quantum logic gates or other types of operations, to extract information from the qubits by performing measurements, or to perform other types of operations. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a hardware test, a quantum error correction procedure, a quantum state distillation procedure, or a combination of these and other types of operations.

At 406, couplings between qubits within clusters in the first layer are used in applying quantum logic. The couplings between qubits within clusters can be used in applying quantum logic gates to the initial and subsequent computational state(s). For instance, the connections between qubit devices in the same cluster on the same layer can include capacitive, inductive, or galvanic coupling between the qubit devices. As an example, with reference to FIG. 2, quantum logic can be applied directly to qubits within the cluster 235 or the cluster 240 in the first layer 202, without utilizing hardware or connections in the second layer 203. In cases where the three-dimensional device topology defines a binary tree structure, the quantum logic can include single-qubit quantum logic gates applied to one or both of the qubit devices in a cluster, two-qubit quantum logic gates applied to both qubit devices in the cluster, or combinations of single-qubit and two-qubit quantum logic gates. In cases where the three-dimensional device topology defines clusters that have more than two qubit devices (e.g., when the tree structure has a branching factor greater than two), the quantum logic can include single-qubit quantum logic gates applied to any of the qubit devices in a cluster, two-qubit quantum logic gates applied pairwise to any pair of qubit devices in the cluster, or combinations of single-qubit and two-qubit quantum logic gates.

At 408, ancilla qubits and/or resonator buses in higher layers are used to communicate between qubit devices in applying quantum logic at 404. The use of ancilla qubits and resonator buses in higher layers for communication between qubits can be used in applying quantum logic gates to the initial and subsequent computational state(s). For instance, in some cases the first layer does not provide connections between qubit devices in different clusters. Thus, a qubit device in a first cluster on the first layer can be coupled to a qubit device in a second, different cluster on the first layer through connections provided in one or more higher layers, for example, through an ancilla qubit on a second layer, which can mediate the interaction between clusters.

At 410, all or part of a computational state can be read out in the first layer. In some instances, information representing the computational state of the qubits can be read out from the composite quantum system by measuring the quantum states of the individual qubits on the first layer. For instance, the quantum processor may include readout devices that selectively interact with the qubit devices on the first layer to detect their quantum states. For example, readout resonators may be configured to produce readout signals that indicate a computational state of the qubits defined in the quantum processor. In some cases, readout may be performed by performing projective measurements to obtain binary readout values from some or all of the qubit devices in the first layer. Other types of readout operations or processes (e.g., expectation value measurements, state tomography, etc.) may be performed in some cases.

In a general aspect, a quantum processor has a tree structure topology that is distributed in three spatial dimensions, in multiple physical layers of the quantum processor.

In a first example, a computational state is encoded in a quantum processor. The quantum processor includes a plurality of devices residing in a plurality of physical layers. The quantum processor includes connections that interconnect the plurality of devices in a tree structure topology. The computational state is encoded in child qubit devices in a first layer of the tree structure topology. A quantum control sequence is applied to at least one of the plurality of devices to transform the computational state in the quantum processor. Applying the quantum control sequence includes using one or more parent qubit devices in a second layer of the tree structure topology to mediate between child qubit devices (e.g., between pairs of qubit devices or between larger clusters of qubit devices) in the first layer of the tree structure topology. A readout of the transformed computational state is performed.

In some cases, implementations of the first example may include one or more of the following features. Encoding the computational state in the child qubit devices may include encoding the computational state in a plurality of logical qubits. At least one of the logical qubits may be defined by multiple child qubit devices. At least one of the logical qubits may be defined by at least one child qubit device and at least one parent qubit device.

In some cases, implementations of the first example may include one or more of the following features. Performing the readout may include operating readout devices associated with the respective child qubit devices. Performing the readout may include performing a partial readout of the transformed computational state.

In some cases, implementations of the first example may include one or more of the following features. Applying the quantum control sequence may include operating a resonator bus associated with the second layer of the tree structure topology to provide an interaction between child qubit devices in the first layer of the tree structure topology. Applying the quantum control sequence may include using the resonator bus to mediate two-qubit entangling gates between multiple pairs of child qubit devices simultaneously. Applying the quantum control sequence may include using direct connections between pairs of the child qubit devices. Applying the quantum control sequence may include transferring one or more qubit states between devices in different layers of the tree structure topology.

In some cases, implementations of the first example may include one or more of the following features. The child qubit devices in the first layer of the tree structure topology may reside in a first physical layer of the quantum processor, and the parent qubit devices in the second layer of the tree structure topology may reside in a second physical layer of the quantum processor. One or more of the child qubit devices may reside in the same physical layer with one or more of the parent qubit devices. A first subset of the child qubit devices may reside in a first physical layer, while a second subset of the child qubit devices may reside in a second physical layer; one or more of the parent qubit devices may reside in the second physical layer, while one or more of the parent qubit devices may reside in a third physical layer. Applying the quantum control sequence may include operating a resonator bus in a root layer of the tree structure topology.

In a second example, a quantum computing system includes a quantum processor. The quantum processor includes a plurality of devices residing in a plurality of physical layers of the quantum processor. The quantum processor includes connections that interconnect the plurality of devices in a tree structure topology that has multiple layers. The tree structure topology includes clusters of child qubit devices in a first layer of the tree structure topology. The tree structure topology includes parent qubit devices in a second layer of the tree structure topology. Each parent qubit device in the second layer is connected to a respective one of the clusters of child qubit devices in the first layer. The quantum computing system includes a control system communicably coupled to the quantum processor and configured to operate the plurality of devices.

In some cases, implementations of the second example may include one or more of the following features. The quantum processor may include readout devices associated with the respective child qubit devices in the first layer of the tree structure topology. The quantum processor may include resonator buses associated with the respective parent qubit devices in the second layer of the tree structure topology.

In some cases, implementations of the second example may include one or more of the following features. The child qubit devices in the first layer of the tree structure topology may reside in a first physical layer of the quantum processor, and the parent qubit devices in the second layer of the tree structure topology may reside in a second physical layer of the quantum processor. One or more of the child qubit devices may reside in the same physical layer with one or more of the parent qubit devices. A first subset of the child qubit devices may reside in a first physical layer, while a second subset of the child qubit devices may reside in a second physical layer; one or more of the parent qubit devices may reside in the second physical layer, while one or more of the parent qubit devices may reside in a third physical layer.

In some cases, implementations of the second example may include one or more of the following features. The tree structure topology may include a resonator bus in a root layer of the tree structure topology. The child qubit devices in the first layer of the tree structure topology may include fixed-frequency qubit devices, tunable-frequency qubit devices or both. The parent qubit devices in the second layer of the tree structure topology may include fixed-frequency qubit devices, tunable-frequency qubit devices or both. The quantum processor may include direct connections between pairs of the child qubit devices within each cluster. Each cluster may have the same number of the qubit devices (e.g., each cluster may have exactly 2, 3, 4, or more qubit devices). Distinct clusters may have different numbers of the qubit devices.

In some cases, implementations of the second example may include one or more of the following features. The tree structure topology can be a binary tree structure topology having a branching factor equal to two. The tree structure topology can have a branching factor greater than two.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. A quantum computing method comprising:
    encoding a computational state in a quantum processor, wherein the quantum processor comprises:
        a plurality of devices residing in a plurality of physical layers; and
        connections that interconnect the plurality of devices in a tree structure topology, wherein the computational state is encoded in child qubit devices in a first layer of the tree structure topology;
    applying a quantum control sequence to at least one of the plurality of devices to transform the computational state in the quantum processor, wherein applying the quantum control sequence comprises using one or more parent qubit devices in a second layer of the tree structure topology to mediate between child qubit devices in the first layer of the tree structure topology; and
    performing a readout of the transformed computational state.

2. The quantum computing method of claim 1, wherein encoding the computational state in the child qubit devices comprises encoding the computational state in a plurality of logical qubits.

3. The quantum computing method of claim 2, wherein at least one of the logical qubits is defined by multiple child qubit devices.

4. The quantum computing method of claim 2, wherein at least one of the logical qubits is defined by at least one child qubit device and at least one parent qubit device.

5. The quantum computing method of claim 1, wherein performing the readout comprises operating readout devices associated with the respective child qubit devices.

6. The quantum computing method of claim 1, wherein performing the readout comprises performing a partial readout of the transformed computational state.

7. The quantum computing method of claim 1, wherein applying the quantum control sequence comprises operating a resonator bus associated with the second layer of the tree structure topology to provide an interaction between child qubit devices in the first layer of the tree structure topology.

8. The quantum computing method of claim 7, wherein applying the quantum control sequence comprises using the resonator bus to mediate two-qubit entangling gates between multiple pairs of child qubit devices simultaneously.

9. The quantum computing method of claim 1, wherein the child qubit devices in the first layer of the tree structure topology reside in a first physical layer of the quantum processor, and the parent qubit devices in the second layer of the tree structure topology reside in a second physical layer of the quantum processor.

10. The quantum computing method of claim 1, wherein applying the quantum control sequence comprises operating a resonator bus in a root layer of the tree structure topology.

11. The quantum computing method of claim 1, wherein applying the quantum control sequence comprises using direct connections between pairs of the child qubit devices.

12. The quantum computing method of claim 1, wherein applying the quantum control sequence comprises transferring one or more qubit states between devices in different layers of the tree structure topology.

13. A quantum computing system comprising:
    a quantum processor comprising:
        a plurality of devices residing in a plurality of physical layers of the quantum processor;
        connections that interconnect the plurality of devices in a tree structure topology, wherein the tree structure topology comprises:
            clusters of child qubit devices in a first layer of the tree structure topology; and
            parent qubit devices in a second layer of the tree structure topology, each parent qubit device in the second layer being connected to a respective one of the clusters of child qubit devices in the first layer; and
    a control system communicably coupled to the quantum processor and configured to operate the plurality of devices.

14. The quantum computing system of claim 13, wherein the quantum processor comprises readout devices associated with the respective child qubit devices in the first layer of the tree structure topology.

15. The quantum computing system of claim 13, wherein the quantum processor comprises resonator buses associated with the respective parent qubit devices in the second layer of the tree structure topology.

16. The quantum computing system of claim 13, wherein the child qubit devices in the first layer of the tree structure topology reside in a first physical layer of the quantum processor, and the parent qubit devices in the second layer of the tree structure topology reside in a second physical layer of the quantum processor.

17. The quantum computing system of claim 13, wherein the tree structure topology comprises a resonator bus in a root layer of the tree structure topology.

18. The quantum computing system of claim 13, wherein the child qubit devices in the first layer of the tree structure topology are fixed-frequency qubit devices, and the parent qubit devices in the second layer of the tree structure topology are tunable-frequency qubit devices.

19. The quantum computing system of claim 13, further comprising direct connections between pairs of the child qubit devices within each cluster of child qubit devices.

20. The quantum computing system of claim 13, wherein the tree structure topology comprises a binary tree structure topology having a branching factor equal to two.

21. The quantum computing system of claim 13, wherein the tree structure topology has a branching factor greater than two.

* * * * *